United States Patent
Beck et al.

(10) Patent No.: US 9,791,531 B2
(45) Date of Patent: Oct. 17, 2017

(54) ESTABLISHING A MAGNETIC RESONANCE SYSTEM ACTUATION SEQUENCE

(71) Applicants: Thomas Beck, Erlangen (DE); Rainer Schneider, Höchstadt (DE)

(72) Inventors: Thomas Beck, Erlangen (DE); Rainer Schneider, Höchstadt (DE)

(73) Assignee: Siemens Aktiengeschaft, München (DE)

( * ) Notice: Subject to any disclaimer, the term of this patent is extended or adjusted under 35 U.S.C. 154(b) by 705 days.

(21) Appl. No.: 14/231,118

(22) Filed: Mar. 31, 2014

(65) Prior Publication Data

US 2014/0292333 A1      Oct. 2, 2014

(30) Foreign Application Priority Data

Apr. 2, 2013   (DE) ................ 10 2013 205 785

(51) Int. Cl.
*G01R 33/24*    (2006.01)
*G01R 33/54*    (2006.01)
*G01R 33/58*    (2006.01)

(52) U.S. Cl.
CPC ......... *G01R 33/543* (2013.01); *G01R 33/243* (2013.01); *G01R 33/246* (2013.01); *G01R 33/583* (2013.01)

(58) Field of Classification Search
CPC . G01R 33/5611; G01R 33/286–33/288; G01R 33/246; G01R 33/3415;

(Continued)

(56) References Cited

U.S. PATENT DOCUMENTS 6,078,177  A        6/2000  Petropoulos et al.
2003/0195413  A1   10/2003  Rubin et al.
(Continued)

FOREIGN PATENT DOCUMENTS

CN   102210587 A    10/2011
DE     4216969 A1   11/1993
(Continued)

OTHER PUBLICATIONS

Chinese office Action for related Chinese Application No. 201410128840.6 dated May 4, 2016, with English Translation.
(Continued)

*Primary Examiner* — Clayton E Laballe
*Assistant Examiner* — Ruifeng Pu
(74) *Attorney, Agent, or Firm* — Lempia Summerfield Katz LLC

(57) ABSTRACT

A method for establishing a magnetic resonance system actuation sequence is described. A first number of field distribution maps are acquired for slices of the measurement region, and a radiofrequency pulse train is established on the basis thereof for the magnetic resonance system actuation sequence. This acquisition of the first number of field distribution maps may be brought about on the basis of an acquisition scheme. A reduced number of field distribution representation maps are established on the basis of the acquired field distribution maps, which field distribution representation maps represent the first number of acquired field distribution maps in accordance with a predetermined optimization criterion, and the radiofrequency pulse train is established on the basis of the field distribution representation maps.

21 Claims, 7 Drawing Sheets

(58) Field of Classification Search
CPC ............ G01R 33/5612; G01R 33/5659; G01R 33/3607; G01R 33/4835
See application file for complete search history.

(56) References Cited

U.S. PATENT DOCUMENTS

| | | | |
|---|---|---|---|
| 2004/0070394 A1* | 4/2004 | Gonzalez Ballester ............ | G01R 33/5611 324/307 |
| 2005/0085713 A1* | 4/2005 | Reeder .................... | A61B 5/055 600/422 |
| 2005/0110488 A1* | 5/2005 | Zhu ........................ | G01R 33/288 324/309 |
| 2009/0080750 A1* | 3/2009 | Krueger ................ | G01R 33/286 382/131 |
| 2010/0066361 A1* | 3/2010 | Setsompop .......... | G01R 33/246 324/309 |
| 2010/0141252 A1* | 6/2010 | Fautz .................... | G01R 33/246 324/307 |
| 2011/0156704 A1* | 6/2011 | Boernert ............. | G01R 33/3415 324/309 |
| 2011/0241680 A1 | 10/2011 | Mossnang et al. | |
| 2012/0007600 A1* | 1/2012 | Boernert ............. | G01R 33/5612 324/310 |
| 2012/0161766 A1* | 6/2012 | Harvey ............... | G01R 33/5612 324/309 |
| 2012/0163692 A1* | 6/2012 | Harvey ............... | G01R 33/5659 382/131 |
| 2012/0262170 A1 | 10/2012 | Gumbrecht | |
| 2012/0268130 A1* | 10/2012 | Fautz .................. | G01R 33/5612 324/318 |
| 2013/0285660 A1* | 10/2013 | Ritter .................. | G01R 33/3607 324/314 |
| 2013/0342200 A1* | 12/2013 | Ugurbil .............. | G01R 33/4835 324/307 |
| 2015/0070013 A1* | 3/2015 | Schmidt ............... | G01R 33/246 324/309 |
| 2015/0108984 A1* | 4/2015 | Pfeuffer ............... | G01R 33/307 324/322 |
| 2015/0323635 A1* | 11/2015 | Haacke .............. | G01R 33/5616 324/309 |
| 2015/0362574 A1* | 12/2015 | Wu ..................... | G01R 33/4835 324/322 |
| 2016/0018502 A1* | 1/2016 | Wang .................. | G01R 33/246 324/307 |
| 2016/0169997 A1* | 6/2016 | Fautz .................... | G01R 33/543 324/309 |
| 2016/0187438 A1* | 6/2016 | Gui ..................... | G01R 33/4818 324/309 |
| 2016/0187446 A1* | 6/2016 | Zhou .................. | G01R 33/4818 324/309 |
| 2016/0223635 A1* | 8/2016 | Den Harder ......... | G01R 33/246 |

FOREIGN PATENT DOCUMENTS

| | | |
|---|---|---|
| DE | 102011006149 A1 | 9/2012 |
| DE | 102012203453 | 9/2013 |
| JP | H08191812 A | 7/1996 |
| JP | H11267112 A | 10/1999 |

OTHER PUBLICATIONS

Grissom W., et al.: "Small-Tip-Angle Spokes Pulse Design Using Interleaved Greedy and Local Optimization Methods", in: Magnetic Resonance in Medicine, pp. 1-10;2012
Ritter, D.: "pTX Pulse Design, Design Specification Version 01", by Siemens AG Healthcare Sector Erlangen, MR Physics Group, pp. 1-102, 2012.
Brunner et al., Optimal Design of Multiple-Channel RF Pulses Under Strict Power and DAR Constraints, 2010, pp. 1280-1291, Magnetic Resonance in Medicine 63.
Cloos et al., kT-Point: Short Three-Dimensional Tailored RF Pulses for Flip-Angle Homogenization Over an Extended Volume, 2012, pp. 72-80, Magnetic Resonance in Medicine 67.
Cunningham et al., Saturated Double-Angle Method for Rapid B1+ Mapping, 2006, pp. 1326-1333, Magnetic Resonance in Medicine 55.
Fautz et al., B1 Mapping of Coil Arrays for Parallel Transmission, 2008, pp. 1247, Proc. Intl. Soc. Mag. Reson. Med. 16.
Funai et al., Regularized Estimation of Main and RF Field Inhomogeneity and Longitudinal Relaxation Rate in Magnetic Resonance Imaging, 2011, pp. 177-180, University of Michigan.
German Office Action cited in German Application No. DE102013205785.7, mailed Mar. 1, 2014.
Grissom et al., Spatial Domain Method for the Design of RF Pulses in Multicoil Parallel Excitation, 2006, pp. 620-629, Magnetic Resonance in Medicine 56.
Jiru et al., Fast 3D Radiofrequency Field Mapping Using Echo-Planar Imaging, 2006, pp. 1375-1379, Magnetic Resonance in Medicine 56.
Katscher et al., Transmit SENSE, 2003, pp. 144-150, Magnetic Resonance in Medicine 49.
Malik et al., Tailored Excitation in 3D with Spiral Nonselective (SPINS) RF Pulses, 2012, pp. 1303-1315, Magnetic Resonance in Medicine 67.
Nehrke et al., Eigenmode Analysis of Transmit Coil Array for Tailored B1 Mapping, 2010, pp. 754-764, Magnetic Resonance in Medicine 63.
Sacolick et al., B1 Mapping by Bloch-Siegert Shift, 2010, pp. 1315-1322, Magnetic Resonance in Medicine 63.
Schneider et al., Inner-Volume Imaging in Vivo Using Three-Dimensional Parallel Spatially Selective Excitation, 2012, pp. 1-12, Magnetic Resonance in Medicine.
Setsompop et al., Magnitude Least Squares Optimization for Parallel Radio Frequency Excitation Design Demonstrated at 7 Tesla with Eight Channels, 2008, pp. 908-915, Magnetic Resonance in Medicine 59.
Stollberger et al., Imaging of the Active B1 Field in Vivo, 1996, pp. 246-251, Magnetic Resonance in Medicine 35.
Wu et al., Adapted RF Pulse Design for SAR Reduction in Parallel Excitation with Experimental Verification at 9.4 T, 2010, pp. 161-170, Journal of Magnetic Resonance 205.
Yoon et al., Fast Joint Design Method for Parallel Excitation Radiofrequency Pulse and Gradient Waveforms Considering Off-Resonance, 2012, pp. 1-8, Magnetic Resonance in Medicine.
Zelinski et al., Fast Slice-Selective Radio-Frequency Excitation Pulses for Mitigating B1+ Inhomogeneity in the Human Brain at 7 Tesla, 2008, pp. 1355-1364, Magnetic Resonance in Medicine 59.
German Office Action cited in German Application No. DE 10 2013 205 785.7, mailed Mar. 1, 2014, with English Translation.
Zelinski et al., Fast Slice-Selective Radio Frequency Excitation Pulses for Mitigating B1+ Inhomogeneity in the Human Brain at 7 Tesla, 2008, pp. 1355-1364, Magnetic Resonance in Medicine 59.

* cited by examiner

ESTABLISHING A MAGNETIC RESONANCE SYSTEM ACTUATION SEQUENCE

CROSS-REFERENCE TO RELATED APPLICATIONS

This application claims the benefit of DE 10 2013 205 785.7, filed on Apr. 2, 2013, which is hereby incorporated by reference in its entirety.

TECHNICAL FIELD

The embodiments relate to methods for establishing a magnetic resonance system actuation sequence. Furthermore, the embodiments relate to methods for operating a magnetic resonance system, a field distribution map analysis apparatus for use in a method for establishing a magnetic resonance system actuation sequence, a control sequence establishment apparatus, and a magnetic resonance system with such a control sequence establishment apparatus.

BACKGROUND

In a magnetic resonance imaging system (abbreviated "magnetic resonance system") the body to be examined may be exposed to a relatively high main magnetic field (the so-called "$B_0$ field"), for example of 1.5, 3, or 7 Tesla, with the aid of a main field magnet system. Additionally, a magnetic field gradient is applied with the aid of a gradient system. Using a radiofrequency transmission system, radiofrequency excitation signals (RF signals) are emitted by suitable antenna apparatuses. The RF signals are intended to lead to the nuclear spin of specific atoms or molecules that are excited resonantly by this radiofrequency field, being tilted by a defined flip angle in relation to the magnetic field lines of the main magnetic field. This radiofrequency excitation or the resulting flip angle distribution will also be referred to as nuclear magnetization or, briefly, "magnetization" in the following text. During the relaxation of the nuclear spins, radiofrequency signals, so-called magnetic resonance signals, are emitted, and are received by suitable reception antennas and processed further. From the raw data acquired thus, it is possible to reconstruct the desired image data. The radiofrequency signals (the so-called "$B_1$ field") for nuclear spin magnetization may be emitted by a so-called "whole body coil" that is arranged securely in the device about the measurement space (patient tunnel). Magnetic resonance signals may be received with the aid of so-called local coils that are positioned more closely on the body of the patient. However, in principle, magnetic resonance signals may also be received by the whole body coil and/or the RF signals may be transmitted using local coils.

For a specific measurement, a magnetic resonance system actuation sequence (also abbreviated as "actuation sequence" in the following text) with a radiofrequency pulse train (RF pulse train) to be emitted and, to be applied coordinated therewith, a gradient pulse train (with matching gradient pulses in the slice selection direction, in the phase encoding direction and in the readout direction, often the z-direction, y-direction and z-direction) are generated in advance. Further control prescriptions are generated in advance, wherein a multiplicity of control prescriptions, like the parameters for the actuation sequence, are defined in a so-called measurement protocol or control protocol. By way of example, this measurement protocol may be recalled from a memory for a specific measurement and may be modified in situ by the user. During the measurement, the magnetic resonance system is controlled completely automatically on the basis of this actuation sequence, wherein the control apparatus of the magnetic resonance system reads out commands from the measurement protocol and works through the commands.

In order to generate the actuation sequences of, in particular, an RF pulse train, a target magnetization, (e.g., a desired spatial flip angle distribution), may be predetermined (by the measurement protocol and/or by the user). Using a suitable RF pulse optimization program that may operate using a numerical optimization method using a target function to be minimized, the matching RF pulse sequence is calculated such that this target magnetization is reached.

To this end, current "field distribution maps", e.g., field distribution maps determined with the current examination object and the current examination arrangement, may be used. These field distribution maps include the "$B_1$ maps" that each specify the spatial $B_1$ field distribution for a specific transmission antenna element, e.g., the spatial sensitivity of the transmission antenna element, and the "$B_0$ maps", which represent, in a spatially resolved manner, the off resonances or deviations of the $B_0$ field from the actually desired homogenous $B_0$ field (e.g., the actually sought-after Larmor frequency). These field distribution maps are taken into account in the optimization method in order to find the ideal actuation sequence for the measurement to be carried out for the current examination object in the current examination environment.

In so doing, the information from the $B_1$ maps and $B_0$ maps is used in the target function in order to be able to take into account inhomogeneities of the $B_1$ field or geometric distortions, e.g., due to radiofrequency shimming in the case of a spatially selective excitation by the transmission antenna elements, etc., and inhomogeneities of the $B_0$ field in order to eliminate, or at least greatly reduce, falsification of the raw data for the magnetic resonance images caused thereby. In the case of so-called parallel transmission methods (pTX methods), radiofrequency pulses are emitted by several independent transmission channels or transmission antenna elements in order to be superposed in the measurement space for achieving an individually definable radiofrequency field. Knowledge about the spatial sensitivity of the transmission coils in question and the present off resonance of the $B_0$ field in respect of the current examination object is an important requirement for being able to calculate suitable pTX-RF pulse sequences.

On the other hand, the amount of data in the field distribution maps, which are included in the numerical optimization process, also has a significant influence on the computational complexity of the optimization method. If the data relate to multi-slice applications, such as in e.g., fMRI (functional magnetic resonance imaging) methods, DWI (diffusion weighted imaging) methods and DTI (diffusion tensor imaging) methods, the data load within the optimization method caused by the field distribution maps becomes problematic, especially in view of the following aspects.

The acquisition of the field distribution maps, e.g., the $B_1$ maps and the $B_0$ maps, is relatively time-consuming for a multiplicity of slices and substantially increases the overall examination duration within the clinical routine. This problem becomes more pronounced if a dynamic update, e.g., a reacquisition, of such field distribution maps is necessary due to patient movements.

The calculation time required to calculate a pTX-RF pulse sequence, specially adapted to the examination object or the examination situation, per slice, becomes unacceptable. Currently, the calculation for a single slice is already a challenge. This applies ever more so if specific restrictions of the hardware. For example, restrictions of the radiofrequency amplifiers or of the gradient system, and the specific absorption rate restrictions (SAR restriction) also have to be taken into account during the pulse sequence calculation.

A theoretically possible solution may lie in calculating a common, identical pTX radiofrequency pulse sequence for all slices to be excited, which is successively applied to the slices, rather than calculating an individual pulse sequence for each individual slice. This offers at least a compromise solution, but is in no way ideal. Although, to this end, several slices may be linked to one another in order to combine the individual optimization for the individual slices to form a single, but large optimization problem, the optimization problem to be solved numerically rapidly grows to huge dimensions, and the dimensions exceed the calculation capacities of standard CPUs and standard RAM hardware. Therefore, specific hardware-technical solutions may be required for this, which may make the devices significantly more expensive.

SUMMARY AND DESCRIPTION

The scope of the present invention is defined solely by the appended claims and is not affected to any degree by the statements within this summary. The present embodiments may obviate one or more of the drawbacks or limitations in the related art.

It is therefore an object of the present embodiments to specify options for establishing a magnetic resonance system actuation sequence taking into account field distribution maps, in which the aforementioned problems are avoided or at least significantly reduced.

In the method for establishing an above-described magnetic resonance system actuation sequence or a radiofrequency pulse train, as described at the outset, a first number of current field distribution maps, in particular, the aforementioned $B_0$ maps and/or $B_1$ maps, are acquired in each case for several slices of the measurement region. Likewise, a radiofrequency pulse train is established on the basis of these field distribution maps, in certain embodiments, in a suitable RF pulse optimization method, for example by one of the known numerical optimization methods. Here, a "field distribution map" is understood to mean a two- or three-dimensional image, wherein the image points, e.g., the individual pixels or voxels, in each case contain a value that represents the respective field or the field deviation at the respective location.

However, unlike previously, the first number of current field distribution maps is acquired on the basis of a specific acquisition scheme in a first variant of the method. In accordance with this acquisition scheme, field distribution maps are established only for a first number of "field distribution representation slices" (also abbreviated as "representation slices" in the following text). Here, these representation slices are selected in such a way that the field distribution maps established for these representation slices represent the field distribution maps of a second number of slices in view of a predetermined optimization criterion, wherein this second number of slices is greater than the first number of field distribution representation slices.

By way of example, the predetermined optimization criterion may be a similarity measure or a similarity metric. Such a similarity measure or such a similarity metric may be understood to mean a specific functional relationship, by which the similarity between two field distribution maps of different slices may be described, e.g., the extent to which two field distribution maps of different slices deviate from one another in accordance with the defined similarity measure. As will be explained below, use may be made of specific "cost functions" in this case, by which differences between two field distribution maps may be defined or detected.

In the second variant of the method, a number of "field distribution representation maps" (also abbreviated as "representation maps" in the following text) are established on the basis of the acquired field distribution maps, which representation maps represent the first number of acquired field distribution maps in accordance with a predetermined optimization criterion. The radiofrequency pulse train is established on the basis of these representation maps, wherein the number of representation maps once again is less than the first number of acquired field distribution maps. In other words, although a greater number of field distribution maps are initially acquired in this second variant, the field distribution maps are reduced while taking into account the optimization criterion (e.g., the already aforementioned similarity measure), namely to the number of representation maps. These representation maps may be a subset of the field distribution maps, but the maps may also be new representation maps, specially formed from the field distribution maps, e.g., in the case by virtue of the representation maps in each case being formed image point-by-image point from the mean values of the field distribution maps, which are represented by the representation maps in accordance with the optimization criterion.

The basic concept of both method embodiments is that the overall duration of the field distribution maps may be reduced by virtue of the fact that, initially, an optimization criterion, e.g., a similarity measure, is set. In accordance with the first embodiments, only field distribution maps are still acquired within a reduced scope. In accordance with the second embodiments, the number of field distribution maps is reduced to a smaller number of representation maps. What is allowed in both embodiments is that the reduced number of field distribution maps, acquired for the representation slices, or the representation maps ideally represent the in fact required number of field distribution maps (e.g., an individual field distribution map respectively for each slice) in respect of the given optimization criterion. As will be shown below, the amount of data required for the necessary field distribution maps therefore may be drastically reduced without a relevant reduction in quality of the imaging.

Depending on which variant of the method is employed, there may already be effects during the acquisition of the field distribution maps, by virtue of, as proposed by the first variant, it already being the case that fewer field distribution maps are acquired. However, the calculation of the radiofrequency pulse trains may at least be carried out with less computational complexity since of course the number of representation maps, which are included as input data in the optimization method for calculating the radiofrequency pulse trains, is reduced in comparison with the field distribution maps that are otherwise employed.

The two variants may also be employed in combination. For example, an acquisition scheme is already employed in the acquisition of the current field distribution maps such that field distribution maps are only established for a first number of representation slices. These acquired field distribution maps are subject to a further analysis in order to determine whether the field distribution maps are, in turn, represented in a suitable manner by an even smaller number of field distribution representation maps such that a predetermined optimization criterion is met, (e.g., that a specific cost or error limit value, which was defined in respect of the optimization criterion, is not exceeded). Using such a two-stage method, it is possible, in particular, to save significant outlay already during the acquisition of the field distribution maps. Nevertheless, there is no risk of, e.g., too few field distribution maps being acquired, which, under certain circumstances, turn out not to be completely ideal in respect of the predetermined optimization criterion. If, by contrast, more than the ideal number of field distribution maps were acquired in respect of the optimization criterion, a further reduction to the representation maps is possible in order to allow that work is only undertaken with the ideal number of representation maps in the calculation method for establishing the radiofrequency pulse train so as to minimize the computational outlay.

A field distribution map analysis apparatus includes an input interface arrangement for detecting a first number of field distribution maps, in particular, $B_0$ maps and/or $B_1$ maps. Depending on which variant of the method is to be carried out, this may relate to the field distribution maps that were acquired for the current examination object, or this may relate to field distribution maps of several examination objects. For example, a multiplicity of patients or subjects may be employed in the acquisition scheme for carrying out the first variant of the method, so as to employ the patients or subjects as test data and thereby establish suitable representation slices.

The field distribution map analysis apparatus furthermore has a field distribution map grouping module, which is configured to establish, on the basis of the detected field distribution maps, a number of field distribution map clusters, e.g., groups of field distribution maps, or a number of representation maps, which represent the first number of acquired field distribution maps in accordance with the predetermined optimization criterion, wherein the number of field distribution representation maps is less than the first number of field distribution maps. The field distribution map analysis apparatus optionally has a representation slice establishment module, which is configured to establish, on the basis of the field distribution map clusters and/or the representation maps, a number of representation slices.

The field distribution map analysis apparatus moreover has an output interface arrangement for outputting established representation maps and/or position information in respect of established representation slices. This position information may be employed at a later stage within the acquisition scheme for acquiring the current field distribution maps in accordance with the first variant of the method.

A control sequence establishment apparatus includes an input interface arrangement for detecting a number of field distribution maps, in particular, $B_0$ maps and/or $B_1$ maps. This input interface arrangement may also serve for detecting further parameters that may be employed for setting the control sequence, e.g., for adopting target magnetizations of k-space trajectories or k-space trajectory types, etc. Such an interface arrangement may consist of several different interfaces, which each detect the relevant data, or else consist of a combined interface, which is able to adopt several data types.

Both in the input interface arrangement of the field distribution map analysis apparatus and in the input interface arrangement of the control sequence establishment apparatus, a detection of the respective data may also, in particular, be understood to mean adopting data from other components of the magnetic resonance system, for example a user interface or from a storage unit with a database, etc., or an adoption from a measurement apparatus or reconstruction apparatus of the magnetic resonance system. Accordingly, the respective input interface arrangement may also be an interface for selecting and adopting data from a data storage arranged within the control sequence establishment apparatus or connected thereto via a network, optionally while also using a user interface. In respect of entering or adopting further data to be predetermined by a user or in respect of entering specific slice positions, the interface arrangement may also have a user interface, in particular, a graphical user interface for manual entry of this data.

The control sequence establishment apparatus moreover has an above-described field distribution map analysis apparatus. Moreover, the control sequence establishment apparatus has an RF pulse establishment unit, for example a suitable optimization unit, so as to establish a radiofrequency pulse train on the basis of the field distribution maps or the representation maps.

Moreover, the control sequence establishment apparatus may have a suitable control sequence output interface in order to pass the control sequence to other control units of the magnetic resonance imaging system. By way of example, the control sequence output interface may be, e.g., an interface that transmits the control sequence to a magnetic resonance control unit in order thereby to control the measurement directly. The control sequence output interface may also be an interface that transmits the data over a network and/or stores said data in a memory for subsequent use.

In addition to a radiofrequency transmission apparatus for emitting the radiofrequency pulses, a magnetic resonance system includes a gradient system for switching the necessary gradients, and a control apparatus configured to emit a radiofrequency pulse train in order to carry out a desired measurement on the basis of a predetermined magnetic resonance system actuation sequence and, coordinated therewith, to emit a gradient pulse train by the gradient system. Moreover, the magnetic resonance system has an above-described control sequence establishment apparatus in order to establish an actuation sequence and transmit the latter to the control apparatus.

Accordingly, in a method for operating a magnetic resonance system according to the above-described method, an actuation sequence is established, and the magnetic resonance system is operated using the actuation sequence.

Essential parts of the field distribution map analysis apparatus and/or of the control sequence establishment apparatus may be configured in the form of software components. This relates, in particular, to the field distribution map grouping module, the optional representation slice establishment module and the RF pulse establishment unit. Likewise, the aforementioned interfaces may, at least in part, be configured in the form of software and optionally resort to hardware interfaces of an available computer. The embodiments therefore also include a computer program, which may be loaded directly into a memory of a field distribution map analysis apparatus and/or control sequence establishment apparatus, comprising program code segments for executing all acts of the method when the program is executed in the field distribution map analysis apparatus or in the control sequence establishment apparatus. Such an implementation by software stored on a non-transitory medium is advantageous in that it is also possible to modify conventional apparatuses, which are used for establishing control sequences, in a suitable manner by implementing the program in order to establish optimized control sequences in the manner.

Conventionally, the radiofrequency pulses are only emitted by one transmission channel and fed into the whole body coil in a suitable manner. In this case, it is possible, for example, to separate the radiofrequency signal and to feed the partial signals, which are shifted by 90° with respect to one another in terms of amplitude and phase and accordingly offset in space, into a whole body coil constructed in the form of a birdcage antenna such that a circularly polarized (only phase) or elliptically polarized (amplitude and phase) $B_1$ field. In one embodiment, a homogeneous $B_1$ field is emitted. In the case of relatively new magnetic resonance systems, it is possible, as was already mentioned above, to occupy the individual transmission channels with individual RF signals adapted for the imaging. To this end, a multichannel pulse train is emitted that includes several individual radiofrequency pulse trains, which may be emitted in parallel by the various independent radiofrequency transmission channels. A multichannel pulse (pTX pulse) may be used as excitation, refocusing, and/or inversion pulse. By way of example, a method for developing such multichannel pulse trains in parallel excitation methods is described in W. Grissom et al.: "Spatial Domain Method for the Design of RF Pulses in Multicoil Parallel Excitation", Mag. Res. Med. 56, 620-629, 2006. Such multichannel systems (pTX systems) may achieve not only a magnetization that is as homogeneous as possible in the desired field of view (FoV) to be examined or in the desired field of excitation (FoE), but it is also possible to predetermine arbitrary spatial patterns for the target magnetization.

One option for establishing a two-dimensional radiofrequency pulse sequence (a so-called "2DRF pulse") in the manner described above in order to excite a defined slice in the examination object is described in the article "Magnitude Least Square Optimization for Parallel Radio Frequency Excitation Design Demonstrated at 7 Tesla With Eight Channels" by K. Setsompop et al. Magn. Reson. Med. 59: 908 to 915, 2008. Here, the transversal target magnetization is represented by a linear matrix equation system made up of the spatial coil profiles and the multichannel radiofrequency pulse sequences, in which information about the present $B_0$ maps and $B_1$ maps and the employed k-space trajectory are also included. This system of equation is solved numerically for a specific predetermined target magnetization in order to obtain the matching radiofrequency pulse sequence.

Similarly, a calculation of a three-dimensional radiofrequency pulse sequence taking into account the $B_0$ maps and $B_1$ maps is also possible in order to excite a three-dimensional volume, which is significantly thicker than a conventional slice, in the examination object. In this respect, see e.g., "Inner-Volume Imaging In Vivo Using Three-Dimensional Parallel Excitation" by J. T. Schneider et al., Magn. Reson. Med. 2012, doi: 10.1002/mrm.24381.

The method offers advantages within the scope of such pTX methods, and so the method may also employed in such a way that the magnetic resonance system actuation sequence set includes, as radiofrequency pulse train, a multichannel pulse train. However, in principle, the method may also be employed very well in conjunction with conventional methods and systems with only one transmission channel.

As already mentioned above, the representation slices or the position data thereof are established on the basis of a plurality of training data records of different examination objects, e.g., patients or subjects, in the first variant of the method. The training data records in each case include a plurality of acquired field distribution maps for the relevant examination object. The training data records may be selected in such a way that the records are specific to examination object types, e.g., different training data records for children or adults, or sex-specific training data records. Likewise, the training data records may be predetermined specifically for examination parameters, in particular, for a region of interest or a body part to be examined or said training data may be specific to the type of examination, for example whether this is an fMRI examination, or to what actuation sequence type this relates. Accordingly, it is also possible to establish specific matching ideal representation slices for the field distribution maps, which representation slices are, for example, stored as parameters in a measurement protocol. In a subsequent measurement, it is possible to carry out the acquisition of the field distribution maps on the basis of this measurement protocol using the ideal acquisition scheme for this specific measurement.

In a variant, a number of representation maps and/or field distribution map clusters are initially established here on the basis of the plurality of acquired field distribution maps, which representation maps and/or field distribution map clusters represent the plurality of acquired field distribution maps in accordance with a predetermined optimization criterion, and the representation slices are established on the basis of the representation maps or field distribution map clusters. In so doing, the field distribution representation slices may, for example, be the slices at which the representation maps were acquired or the positions of the field distribution maps that each represent a field distribution map cluster.

It is possible initially to establish the representation slices separately for each examination object within the training data records and, overall, to obtain the ideal common representation slices for all training data records by combining the representation slices for the various examination objects. However, in principle, it is also possible initially to combine the training data records of the various examination objects to form a common training data record and to determine the ideal representation slices therefrom. By way of example, field distribution maps or images may be combined as follows.

In the case of common optimization (common training data record), all training data are used simultaneously in the method during the clustering. The number of examination objects is only a further dimension of the input data. The slice-specific cost calculation between two slices may additionally be iterated over the number of objects.

In the case of separate optimization for different examination objects, the results of the individual subjects may be combined using suitable methods, for example by averaging within a certain variance.

By way of example, the representation maps may include a subset of the field distribution maps. This means that, for example, only certain field distribution maps are selected from the totality of all field distribution maps, which subset represents the totality of the field distribution maps well in accordance with the predetermined optimization criterion. Alternatively, or in addition thereto, representation maps may also be formed by virtue of the fact that values of the representation maps are generated from the field distribution maps, which values are represented by the relevant field distribution representation map. An example may be a mean value map, in which the values at the individual image points are formed by the mean values of the image points of the field distribution maps represented by the representation map. However, other combination methods are likewise also possible, as was already mentioned above.

The field distribution representation maps and/or the field distribution representation slices may be established by a cluster formation method, in which field distribution maps are grouped to form field distribution map clusters in accordance with the predetermined optimization criterion, in certain embodiments, in accordance with the given similarity measure. As a result of such cluster formation or grouping methods, it is possible, for example, to combine precisely those field distribution maps that are the most similar in accordance with a similarity measure. In this manner, the number of field distribution maps may be reduced without this leading to strong effects in the subsequent calculations of the magnetic resonance system actuation sequence and to quality losses in the imaging.

In certain embodiments, a cluster representation map is in each case assigned to a field distribution map cluster, where the cluster representation map represents the field distribution maps of the respective cluster. Here, this may be a representative field distribution map of the field distribution maps belonging to the cluster or a specific map produced from the field distribution maps, for example an average value map.

The grouping may be brought about in several levels or several method acts in the cluster formation method. In so doing, in each level (if the method is already at a higher level), exactly two field distribution maps or field distribution map clusters, that have the smallest deviations from one another in accordance with a predetermined optimization criterion may be grouped together to form one new field distribution map cluster for the next level. Thus, using this method, a grouping tree or cluster tree may be set up level-by-level, where the tree contains exactly one field distribution map or one field distribution map cluster less in each level as two field distribution maps or field distribution map clusters were combined. All field distribution maps for all slices are contained in the lowest level of this cluster tree and only one common field distribution map cluster or one representation map for all field distribution maps is still there in the uppermost level.

In certain embodiments, the deviations between two field distribution maps and/or field distribution map clusters or the associated cluster representation maps are established in each case by a cost function. Additionally, or as an alternative thereto, a cost value also may be calculated for each level of the cluster formation method in accordance with the predetermined optimization criterion. To the extent that the predetermined optimization criterion is the similarity measure, such a cost value, for example, may correspond to a deviation error, which states how dissimilar two field distribution maps are. The cost value for one level of a cluster formation method, for example, may be given by the cost value that was accepted by combining the two field distribution maps or field distribution map clusters in the respective level.

In order to accelerate the method, a cost matrix may be produced for a set of field distribution maps and/or field distribution map clusters, (for example, for the current field distribution maps and/or field distribution map clusters in each level of the above-described cluster formation method). This is only still updated in each level for the current field distribution maps and/or field distribution map clusters. In this respect, different options will still be set out below.

In the cluster formation method, it is possible that all levels are run through, starting from all field distribution maps in all slices up to a single field distribution map in the last level, which represents all field distribution maps included in the cluster formation method. However, a single field distribution map only may not be a good representation for all field distribution maps and the use only of one single common representation map for all initial field distribution maps may lead to a relatively large deviation error. It is therefore expedient to select an ideal number of representation maps and/or representation slices within this cluster formation method. That is to say that, in the case of a multi-level cluster formation method, it is, for example, possible to select which field distribution maps or field distribution map clusters in which level ideally represent the included field distribution maps in respect of the optimization criterion.

This may be carried out if, in particular, a cost value, (on the basis of the information content of the field distribution maps, e.g., a deviation error), was in actual fact already calculated for each level of the cluster formation method. By way of example, a criterion for selecting the number of representation maps and/or representation slices may consist of predetermining a maximum admissible cost value and the number being selected in such a way that this cost value is just undershot. Another option consists of the increase behavior of the cost value being taken into account depending on the number of representation maps or representation slices, e.g., the increase behavior of the cost value depending on the level of the cluster formation method. It is possible to select precisely that level or that number of representation maps or representation slices, at which the cost value may increase undesirably in the case of a further reduction.

Alternatively, it is also possible to predetermine a minimum number or even a specific number of representation maps or representation slices. It is likewise possible to predetermine a specific reduction level, for example, in order to reduce the number of slices or field distribution maps by a specific factor or percentage.

Incidentally, the representation maps and/or the representation slices may also be established taking into account at least one of the following further input parameters:

A weighting value may be predetermined as a further input parameter. By the weighting value, it is possible to set, for example, how different types of field distribution maps are weighted within the method. By way of example, it may be possible to set whether the similarity between the $B_0$ maps or between the $B_1$ maps is more important for different slices, to the extent that $B_0$ maps and $B_1$ maps are grouped together.

In this case, it may be taken into account that, in principle, a set of $B_0$ maps, (e.g., the $B_0$ maps in the various slices), and the various $B_1$ map sets assigned to the individual radiofrequency channels or the specific transmission coils, (e.g., the $B_1$ maps for the radiofrequency channels or transmission coils in the various slices), may be considered separately. That is to say that the method may be carried out independently in each case for the $B_0$ map set and also for each individual radiofrequency transmission antenna or the $B_1$ map set thereof. This may lead to different representation maps and/or representation slices being established for the $B_0$ maps or for the $B_1$ maps of the different radiofrequency channels. However, in principle, it is also possible to combine all different field distribution maps or at least the $B_1$ maps for the different radiofrequency channels and establish common representation slices, for which the $B_0$ maps or the $B_1$ maps for the various radiofrequency channels are established in each case. If the weighting is focused more on the $B_0$ maps, it is possible to take into account more strongly off resonance effects. By contrast, if the weighting is shifted in respect of the $B_1$ maps, it is possible to take into account more strongly shadowing effects amongst the transmission coils.

A further input parameter that may be employed when establishing the field distribution representation maps and/or the field distribution representation slices is the specification of a defined region of interest within the measurement region such that said region of interest may be taken into account separately within the reduction process or the cluster formation method. This promotes the accuracy in the desired specific region.

Furthermore, specific criteria for the ideal selection of the field representation maps, determined from the training data records, may be used as input parameters when establishing the field distribution representation maps and/or the field distribution representation slices. For example, the results of preceding optimizations are used to improve subsequent optimizations and thus, as it were, a learning optimization system is developed.

Furthermore, a sequence type of the magnetic resonance system actuation sequence to be generated may be taken into account, for example, what type of pulse sequence this is, such as:

(1) turbo spin echo sequence (TSE). Such a sequence is very sensitive in relation to $B_1$ inhomogeneities but more robust in relation to $B_0$ inhomogeneities.

(2) gradient echo sequence (GRE) with a low flip angle exhibits rather the opposite behavior compared to a turbo spin echo sequence.

(3) sequences with 3D excitation pulses. In this case, the pulses tend to be long such that a priori there may be greater weighting on the off resonance.

(4) sequences with greatly accelerated spiral pulses. The sequences are very short, and so only a low weighting of the $B_0$ maps may be necessary.

(5) sequences for applications that merely relate to a $B_1$ shimming. The $B_0$ maps are not taken into account.

By way of example, this may also be used to modify the aforementioned weighting value since the weighting for different radiofrequency pulse types and the characteristics thereof may be different. It is also possible to determine the reduction level differently depending on predetermined body regions or on applied sequence types. To this end, information about the reduction level may be stored, for example, within the measurement protocols, in which of course also a specific pulse sequence type is predetermined such that the reduction level matches the pulse sequence type. However, these parameters may be modified by the user, in particular, when calling the protocol still for the current measurement, as is also possible in the case of other parameters within the measurement protocol.

In practice, the field distribution maps may change dynamically with time, for example as a result of instability of the device and/or movements and physiology (e.g., respiration, heartbeat) of the patient/subject. Therefore, current field distribution maps may be detected once again during a measurement, (e.g., within the scope of a measurement session), in which conventionally a plurality of recordings are made or a plurality of measurement sequences are run through. By way of example, this may be repeated at regular time intervals or else at irregular intervals. There may likewise be an event-controlled re-measurement, for example if this is detected by MR signals (internally) or by external sensors (e.g., movement sensor, magnetic field sensor).

DETAILED DESCRIPTION

Figure 1:
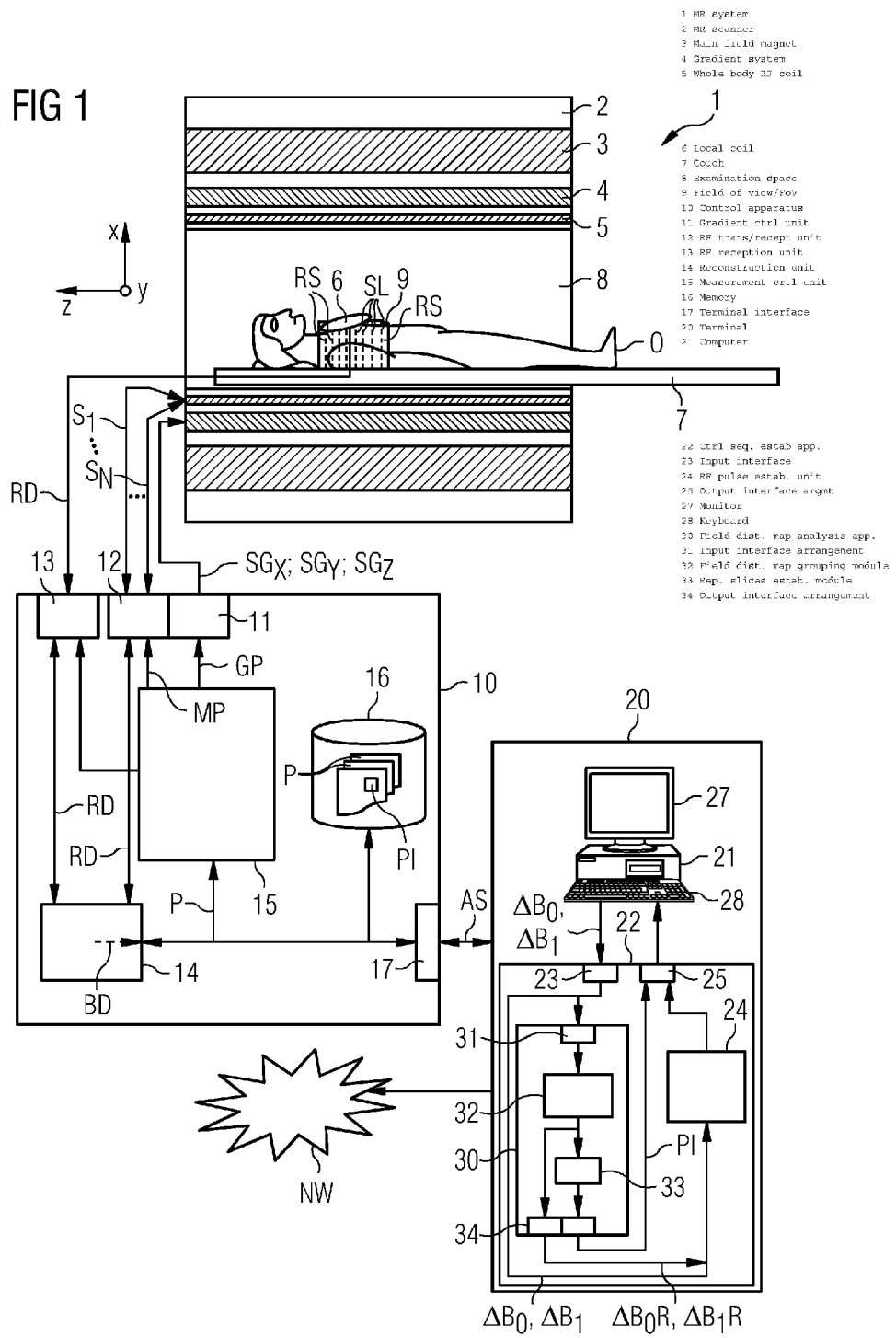
FIG. 1 depicts a schematic depiction of an exemplary embodiment of a magnetic resonance system.

FIG. 1 depicts, in a schematic manner, a magnetic resonance machine 1. The magnetic resonance machine 1 includes the actual magnetic resonance scanner 2 with an examination space 8 or patient tunnel situated therein. A couch 7 may be displaced into this patient tunnel 8 such that, during an examination, an examination object O (patient/subject) may be placed at a specific position within the magnetic resonance scanner 2 relative to the magnet system and radiofrequency system arranged therein and also be moved between different positions during a measurement.

Essential components of the magnetic resonance scanner 2 are a main field magnet 3, a gradient system 4 with magnetic field gradient coils for applying any magnetic field gradients in x-, y- and z-directions, and also a whole body radiofrequency coil 5. Magnetic resonance signals induced in the examination object O may be received by the whole body coil 5 with which the radiofrequency signals may also be emitted for inducing the magnetic resonance signals. However, these signals may be received by local coils 6 that are, e.g., placed onto or under the examination object O. A person skilled in the art knows of all these components as a matter of principle and the components are therefore only depicted very schematically in FIG. 1.

By way of example, the whole body radiofrequency coil 5, e.g., in the form of a so-called birdcage antenna, may have a number N of individual antenna rods, which may be actuated separately by a control apparatus 10 as individual transmission channels $S_1, \ldots, S_N$, (e.g., the magnetic resonance imaging system is a pTX-capable system). However, reference is explicitly made to the fact that the method may also be applied to conventional magnetic resonance imaging devices with only one transmission channel.

The control apparatus 10 may be a control computer, which may also consist of a multiplicity of individual computers that are optionally also spatially separated and interconnected by suitable cables or the like. By a terminal interface 17, this control apparatus 10 is connected to a terminal 20, by which an operator may actuate the whole machine 1. In the present case, this terminal 20 has a computer 21 with a keyboard 28, one or more monitors 27 and further input devices, such as, e.g., a mouse or the like, so that a graphical user interface is available to the user.

The control apparatus 10 has, inter alia, a gradient control unit 11, which in turn may include several sub-components. Control signals $SG_x$, $SG_y$, $SG_z$ are wired to the individual gradient coils using this gradient control unit 11. Here, the control signals are gradient pulses, which are placed at precisely stipulated points in time and with a precisely predetermined time profile during a measurement.

The control apparatus 10 moreover has a radiofrequency transmission/reception unit 12. This RF transmission/reception unit 12 likewise consists of several sub-components, so as to emit radiofrequency pulses, in each case separately and in parallel, to the individual transmission channels $S_1, \ldots, S_N$, (e.g., to the individually actuatable antenna rods of the body coil). It is also possible to receive magnetic resonance signals by the transmission/reception unit 12. However, the signals may be received with the aid of the local coils 6. The raw data RD received by the local coils 6 are read out and processed by an RF reception unit 13. The magnetic resonance signals received thereby or by the whole body coil by the RF transmission/reception unit 12 are transmitted to a reconstruction unit 14 as raw data RD. The reconstruction unit reconstructs the image data BD therefrom and stores the image data BD in a memory 16 and/or transmits the image data BD to the terminal 20 via the interface 17 such that the user may observe the image data BD. The image data BD may also be stored and/or displayed and evaluated at other locations via a network NW. Provided that the local coils have a suitable switching unit, the local coils too may be connected to an RF transmission/reception unit so as also to use the local coils for transmission.

The gradient control 11, the RF transmission/reception unit 12, and the reception unit 13 for the local coils 6 are actuated in each case in a coordinated fashion by a measurement control unit 15. By appropriate commands, the measurement control unit 15 allows that a desired gradient pulse train GP is transmitted by suitable gradient control signals $SG_x$, $SG_y$, $SG_z$ and, in parallel therewith, actuates the RF transmission/reception unit 12 in such a way that a multichannel pulse train MP is emitted. (e.g., that, on the individual transmission channels $S_1, \ldots, S_N$ in parallel, the matching radiofrequency pulses are transmitted to the individual transmission rods of the whole body coil 5). Moreover, it is necessary to allow that, at the appropriate time, the magnetic resonance signals at the local coils 6 are read out and processed by the RF reception unit 13 or possible signals on the whole body coil 5 are read out and processed by the RF transmission/reception unit 12. The measurement control unit 15 predetermines the appropriate signals, such as the multichannel pulse train MP at the radiofrequency transmission/reception unit 12 and the gradient pulse train GP at the gradient control unit 11, in accordance with a predetermined control protocol P. All control data that need to be set during a measurement are stored in this control protocol P.

Conventionally, a multiplicity of control protocols P for various measurements are stored in a memory 16. The control protocols P may be selected by the user via the terminal 20 and, if required, be varied in order to have available an appropriate control protocol P for the currently desired measurement, by which control protocol the measurement control unit 15 may operate. Incidentally, the user may also download control protocols, for example, from a manufacturer of the magnetic resonance system via a network NW and optionally modify and use the control protocols.

However, the basic course of action of such a magnetic resonance measurement and the aforementioned components for actuation are known to a person skilled in the art, and so the components are not discussed here in any more detail. Incidentally, such a magnetic resonance scanner 2 and the associated control apparatus moreover may have a multiplicity of further components that are likewise not mentioned here in detail. Reference is also made at this point to the fact that the magnetic resonance scanner 2 may also have a different configuration, for example, with a patient space open to the side, and that, in principle, the radiofrequency whole body coil need not be configured as a birdcage antenna.

In this case, a control sequence establishment apparatus 22 is moreover depicted schematically in FIG. 1. The control sequence establishment apparatus 22 serves for establishing a magnetic resonance system actuation sequence AS. For a specific measurement, this magnetic resonance system actuation sequence AS contains, inter alia, a pulse sequence with a gradient pulse train GP, for running through a specific trajectory in k-space, and, coordinated therewith, a radiofrequency pulse train, in this case a multichannel pulse train MP, for actuating the individual transmission channels $S_1, \ldots, S_N$. The magnetic resonance system actuation sequence AS is created on the basis of parameters predetermined in the measurement protocol P in the present case.

Here, the control sequence establishment apparatus 22 is depicted as part of the terminal 20 and may be realized on the computer of this terminal 21 in the form of software components. However, in principle, the control sequence establishment apparatus 22 may also be part of the control apparatus 10 or realized in a separate computer system and the complete actuation sequences AS are transmitted to the magnetic resonance system 1 via a network NW, optionally within the scope of a complete control protocol P as well. In an embodiment, if the control sequence establishment apparatus 22 is itself part of the control apparatus 10 or connected via a fast connection to the terminal 20 or a suitable fast computer with sufficient computing capacity, a current new control sequence may also be established on the basis of current initial conditions, (for example an updated $B_0$ map and/or updated $B_1$ maps, during a measurement session, e.g., during the progress of an examination of a patient).

The $B_0$ maps and $B_1$ maps, which, as explained below, are required in the calculation of the ideal RF pulse trains for the excitation, are acquired at least before the start of the actual measurement for several slices SL within a field of view 9 (FoV) within the examination object O, of which slices magnetic resonance recordings may also be produced. Overall, one $B_0$ map and several $B_1$ maps, namely one for each transmission channel, are recorded to this end for each slice SL in the methods conventional up until now. By way of example, if, overall, $B_0$ maps and $B_1$ maps are required for 40 slices in a system with 10 transmission channels, it is hence necessary to acquire a total of 440 slices.

A $B_0$ map of a slice SL may be acquired in different ways. By way of example, two gradient echo images of the slice may be acquired with different echo times and the $B_0$ map is estimated from the difference in the phase images and the difference in the echo times (see e.g., M. A. Bernstein et al. "Handbook of MRI pulse sequences", 2004, Elsevier Academic Press). There are also various methods for establishing $B_1$ maps. By way of example, one method is described in H. Fautz et al. "B1 mapping of coil arrays for parallel transmission", ISMRM, 2008. If need be, the acquisition of the $B_0$ maps and $B_1$ maps may likewise be predetermined and controlled by the control protocol P.

Here, the control sequence establishment apparatus 22 has an input interface 23. By this input interface 23, the control sequence establishment apparatus 22 receives a target magnetization m, which prescribes the intended flip angle distribution during the desired measurement, a k-space trajectory or a k-space trajectory type and optionally further input parameters that will in part be explained in more detail in conjunction with FIG. 2. By this input interface 23, the control sequence establishment apparatus 22 may also detect or adopt the acquired $B_0$ maps and $B_1$ maps.

In particular, the control sequence establishment apparatus 22 includes an RF pulse establishment unit 24, for example a suitable optimization unit 24, in which a radiofrequency pulse train MP is established on the basis of the aforementioned input data using a suitable optimization method, which will still be described below.

Moreover, the control sequence establishment apparatus 22 in this case also includes a field distribution map analysis apparatus 30. This field distribution map analysis apparatus has an input interface arrangement 31, by which, e.g., the $B_0$ maps $\Delta B_0$ and/or the $B_1$ maps $\Delta B_1$ are adopted. Moreover, this field distribution map analysis apparatus 30 has a field distribution map grouping module 32. With the aid of this field distribution map grouping module 32, a number of field distribution map clusters C and/or field distribution representation maps $\Delta B_0 R$, $\Delta B_1 R$, (which represent the incoming number of acquired field distribution maps $\Delta B_0$, $\Delta B_1$ in accordance with a predetermined optimization criterion or similarity criterion), are established in the manner still to be described below by skillful grouping of the detected field distribution maps. That is to say that the incoming $B_0$ maps $\Delta B_0$ and/or the $B_1$ maps $\Delta B_1$ are ultimately reduced to suitable representatives. By an output interface arrangement 34, it is possible to pass these reduced $B_0$ and $B_1$ maps, e.g., the representation maps $\Delta B_0 R$, $\Delta B_1 R$, as input data directly to the RF pulse establishment unit 24, such that the latter may operate using the reduced number of maps in order to establish the ideal radiofrequency pulse train MP. Additionally, the field distribution map analysis apparatus in this case also has a representation slice establishment module 33. The latter may establish a number of field distribution representation slices RS or the position information PI thereof on the basis of the field distribution map clusters C and/or the field distribution representation maps $AB_0 R$, $\Delta B_1 R$. The position information PI may likewise be output by the output interface arrangement 34.

Either the position information PI or the established radiofrequency pulse train MP may be output again by the control sequence establishment apparatus 22 by an output interface arrangement 25. In one embodiment, the field distribution map analysis apparatus 30 initially only operates to establish ideal positions of representation slices RS, at which the matching number of $B_0$ maps and/or $B_1$ maps are acquired for a subsequent measurement. To this end, the position information PI is passed to the control apparatus 10 such that the latter may acquire the $B_0$ maps and/or $B_1$ maps, which are in turn passed to the control sequence establishment apparatus 22. In the second case, the field distribution map analysis apparatus 30 serves to prepare or reduce the originally acquired $B_0$ maps and/or $B_1$ maps such that the ideal radiofrequency pulse train MP for the subsequent current magnetic resonance measurement may immediately be created by the control sequence establishment apparatus 22. The radiofrequency pulse train is passed to the control apparatus 10, for example, within the scope of a control protocol P or measurement protocol, where further prescriptions are specified for actuating the magnetic resonance system 1 (e.g., parameters for reconstructing the images from the raw data, etc.).

If the actuation sequence AS is to be updated during the course of a measurement session, this may also be stored in the control protocol P such that a new actuation sequence AS is established automatically in the manner by the control apparatus 10 at the suitable times or said new actuation sequence is e.g., requested from the terminal 20 or another computer.

The course of a method for establishing a magnetic resonance system actuation sequence AS is explained using an example in the following text on the basis of the flowchart in accordance with FIG. 2.

In act I, the various parameters used within the scope of the further method are first of all predetermined or adopted. By way of example, $B_1$ maps $\Delta B_1$ are adopted for the individual transmission channels and slices in act Ia and the current measured $B_0$ maps $\Delta B_0$ are adopted for the slices in act Ib.

System specific parameters SP, such as the number of transmission channels, a maximum slew rate, a maximum gradient amplitude etc., are adopted in act Ic and different examination specific parameters, such as the positioning of the slices SL to be recorded, the sequence type ST, etc., are adopted in act Id. Moreover, a desired target magnetization m is predetermined in act Ie.

Finally, in act If, an exact k-space trajectory or a k-space trajectory type kTT is predetermined, for example, whether this is a straight-line trajectory, a spiral trajectory, a radial trajectory, etc. This is because, in order to generate the actuation sequence, the individual RF pulse trains, e.g., the RF trajectories, may be established for the individual transmission channels over time depending on a fixed "k-space trajectory" in an optimization method where the fixed k-space trajectory may be predetermined by a measurement protocol or individually by an operator. The "transmission k-space trajectory" (abbreviated to "trajectory" in the following text) is those locations in k-space that are arrived at specific times by setting the individual gradients. The k-space is the spatial frequency space and the trajectory in k-space describes on what path the k-space is passed over in time when emitting an RF pulse by appropriate switching of the gradient pulses. Thus, by setting the k-space trajectory, it is possible to determine at which spatial frequencies specific RF energy amounts are deposited. If only one k-space trajectory type kTT is predetermined by the user or by the measurement protocol, it is possible to calculate an optimized k-space trajectory in the method.

The sequence of the method acts Ia to If is arbitrary.

In act II, an optimized k-space trajectory may be established, provided that the k-space trajectory was not set in advance. To this end, there are different options. A suitable procedure is described in, e.g., DE 10 2012 212 376.

In the process, the k-space trajectory may be established in such a way that the k-space is undersampled in the case of an actuation of the magnetic resonance system with the aid of the created magnetic resonance system actuation sequence. This is expedient if a pTX system is employed, since an acceleration of the excitation and, as a result thereof, of the measurement is possible by skillful undersampling and simultaneously using the parallel transmission method. Thus, for example, in an embodiment, the k-space, at least in regions, may be undersampled using a regular pattern, for example, using a so-called TX-SENSE method (SENSE=sensitivity encoding). In a further method, the undersampling of the k-space, at least in regions, takes place using an irregular pattern and/or randomly, which, for example, is possible in conjunction with so-called "compressed sensing" methods.

In act III, the radiofrequency pulse train, in this case a multichannel pulse train, is designed automatically. The individual RF pulse sequences for the different transmission channels are developed here, that is to say there is an exact calculation relating to what RF pulse form has to be transmitted on what channel. This is initially carried out for a so-called "low flip region" with flip angles below 5°, since the magnetization property is still linear in this region. In so doing, an iterative optimization method is applied because this was found to be suitable. Specifically, use is made here of the so-called conjugate gradient method (CG method). However, in principle, it is also possible to use other optimization methods, even ones that are not iterative.

This may happen using any method. In many previously known methods, the optimization method is brought about in such a way that e.g., the least mean square between the target magnetization and the actual magnetization is minimized. That is to say, the following solution is sought after:

$$\min(\|m_{ist}-m\|^2). \tag{1}$$

Here, m is the target magnetization and $m_{ist}=A \cdot b(t)$ is the (theoretical) actual magnetization achieved by an RF pulse train b(t), wherein A is the so-called design matrix, consisting of a system of linear complex equations that include the spatial coil profiles, the available $B_0$ maps and $B_1$ maps and the employed k-space trajectory. By way of example, this design matrix is described in W. Grissom et al.: "Spatial Domain Method for the Design of RF Pulses in Multicoil Parallel Excitation", Mag. Res. Med. 56, 620-629, 2006. The larger the number of $B_0$ maps and $B_1$ maps is, the more complicated this design matrix becomes, and hence the optimization method is also more complicated. b(t) is a vector that contains the e.g., N functions $b_c(t)$ (one function for each transmission channel c=1 to N). This equation is drawn up in act IIIa, for example. If the solution of equation (1) is found, a function of the amplitude depending on the time for all available transmission channels is present as the result. However, both the setting up of equation (1) and different solution options are known to a person skilled in the art and need not be explained in detail here. Optionally, an optimized solution may also be brought about using an iterative method, for example, by virtue of boundary conditions to be taken into account being modified in each iteration act when solving the equation in order to achieve an additional optimization of the radiofrequency exposure of the patient.

The available multichannel pulse sequence obtained at the end of the optimization act III for the low flip region may be scaled up in step IV in order to achieve the actually desired target magnetization, since the latter normally does not lie in a flip angle region of 5°, but rather goes up to a 90° flip angle. This is brought about by multiplying the amplitudes of the individual pulses by the desired scaling factor.

In act V, the error, which may occur when scaling up, is corrected by a partial Bloch simulation. Such a partial Bloch simulation is only carried out at discrete times within the pulse sequence. Here, the data for the respective time at which the check may take place are tested with application of the Bloch equations in a simulator with application of the Bloch equations and the achieved magnetization is calculated thus. It is possible to discover deviations from the prescription of the target magnetization and correspondingly, relatively small corrections may be carried out by changing the radiofrequency pulse sequences.

There is, once again, a test of all found parameters in act VI by a temporally complete Bloch simulation. Here, a check is carried out as to whether the magnetization achieved by the parameters actually corresponds to the target magnetization.

In act VII, the actuation sequence AS is passed on for buffer storage or immediate execution.

Figure 2:
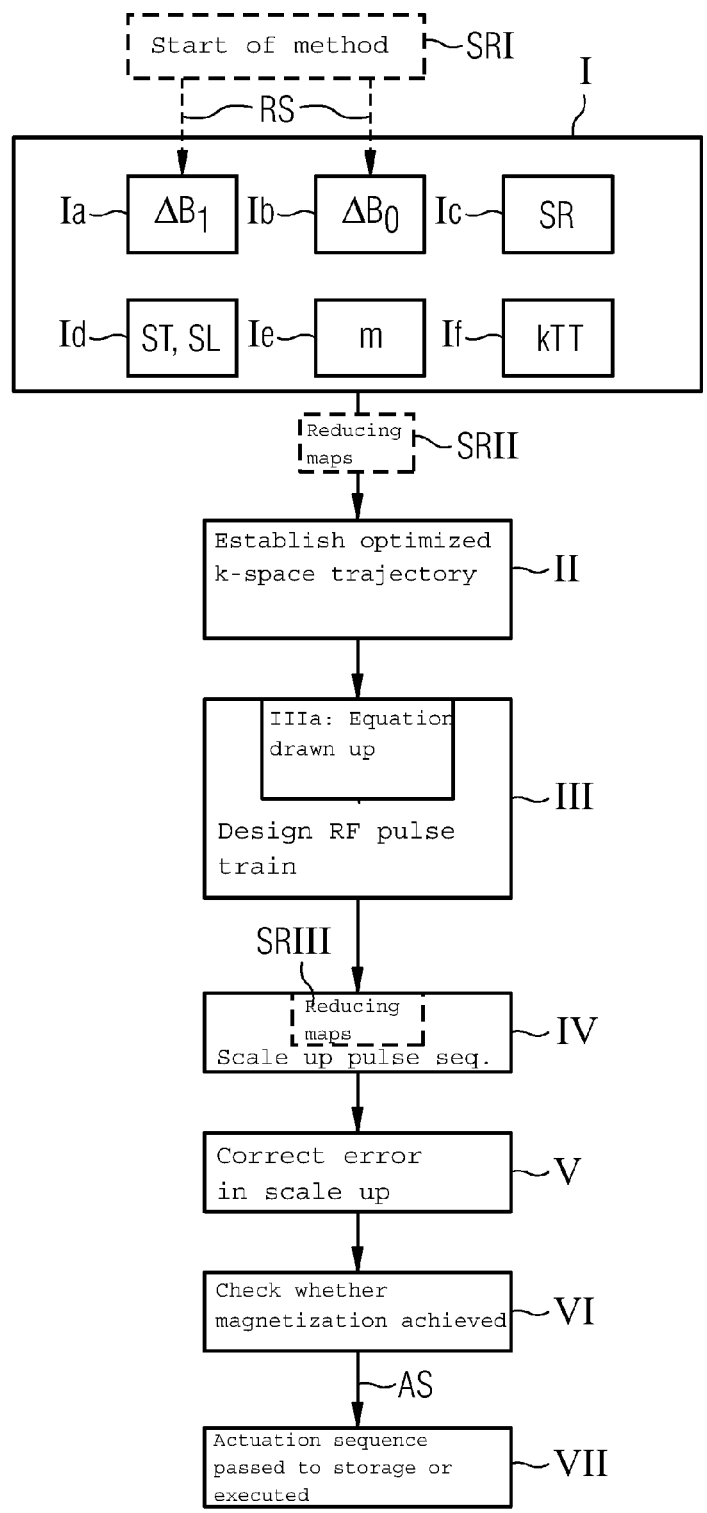
FIG. 2 depicts a flowchart for a possible sequence in accordance with one exemplary embodiment of the method for determining an actuation sequence.

In FIG. 2, options are highlighted at three different positions, at which the method for establishing the magnetic resonance system actuation sequence AS may be modified so as to operate.

A first option is already acting on the method before the sequence starts by way of a method act SRI so that the $B_0$ maps $\Delta B_0$ and the $B_1$ maps $\Delta B_1$ are only established for specific representation slices RS and not for all slices SL at which raw data for reconstructing the magnetic resonance images is subsequently also to be acquired. In this manner, it is possible to drastically reduce the number of $B_0$ maps and $B_1$ maps to be acquired and therefore significantly reduce the overall measurement time.

A second option consists of reducing the measured $B_1$ maps $\Delta B_1$ and $B_0$ maps $\Delta B_0$ in the manner in the method act SRII and, in the process, selecting specific field distribution representation maps $\Delta B_0 R$, $\Delta B_1 R$ from the acquired $B_0$ maps $\Delta B_0$ and $B_1$ maps $\Delta B_1$, which field distribution representation maps represent the complete set of maps well, respectively under specific similarity conditions. The same method is also applied in the possible method act SRIII.

The difference between these two method acts SRII, SRIII is the fact that method act SRII may symbolize the case where, in acts II to VII, an individual pulse train or an individual actuation sequence is intended to be calculated for each of the slices to be excited in order to acquire the raw data for the respective slice. In this case, the method may allow that a radiofrequency pulse train is only still calculated for the slices for which $B_1$ maps $\Delta B_1$ or $B_0$ maps $\Delta B_0$ were respectively established, which represent the $B_1$ maps or $B_0$ maps of the other slices, which radiofrequency pulse train may be applied to all slices represented by the respective representative slice. That is to say if, for example, a recording is to be brought about in 40 slices and the 40 slices, in respect of the $B_1$ and/or $B_0$ maps, are represented by four slices that each represent 10 of the slices, it is sufficient to calculate a radiofrequency pulse train for these four slices and likewise apply the pulse train of the respective representative slice to the slices represented thereby.

In contrast thereto, the method act SRIII may represent the case where, for example, a magnetic resonance system actuation sequence with a radiofrequency pulse train is to be calculated for exciting a 3D volume or a common optimized pulse train is to be calculated for a multi-slice excitation. In this case, all $B_0$ maps and $B_1$ maps for all slices of course have to be included in the design matrix A in act IV within the optimization method. If the inclusion is preceded by a reduction of the $B_0$ maps or $B_1$ maps, the design matrix may have a less complicated structure, as a result of which the computational outlay in act IV is greatly reduced.

What is common to all three method acts SRI, SRII, SRIII is that $B_1$ maps and $B_0$ maps are in some way reduced to representative $B_1$ maps and $B_0$ maps.

Figure 3:
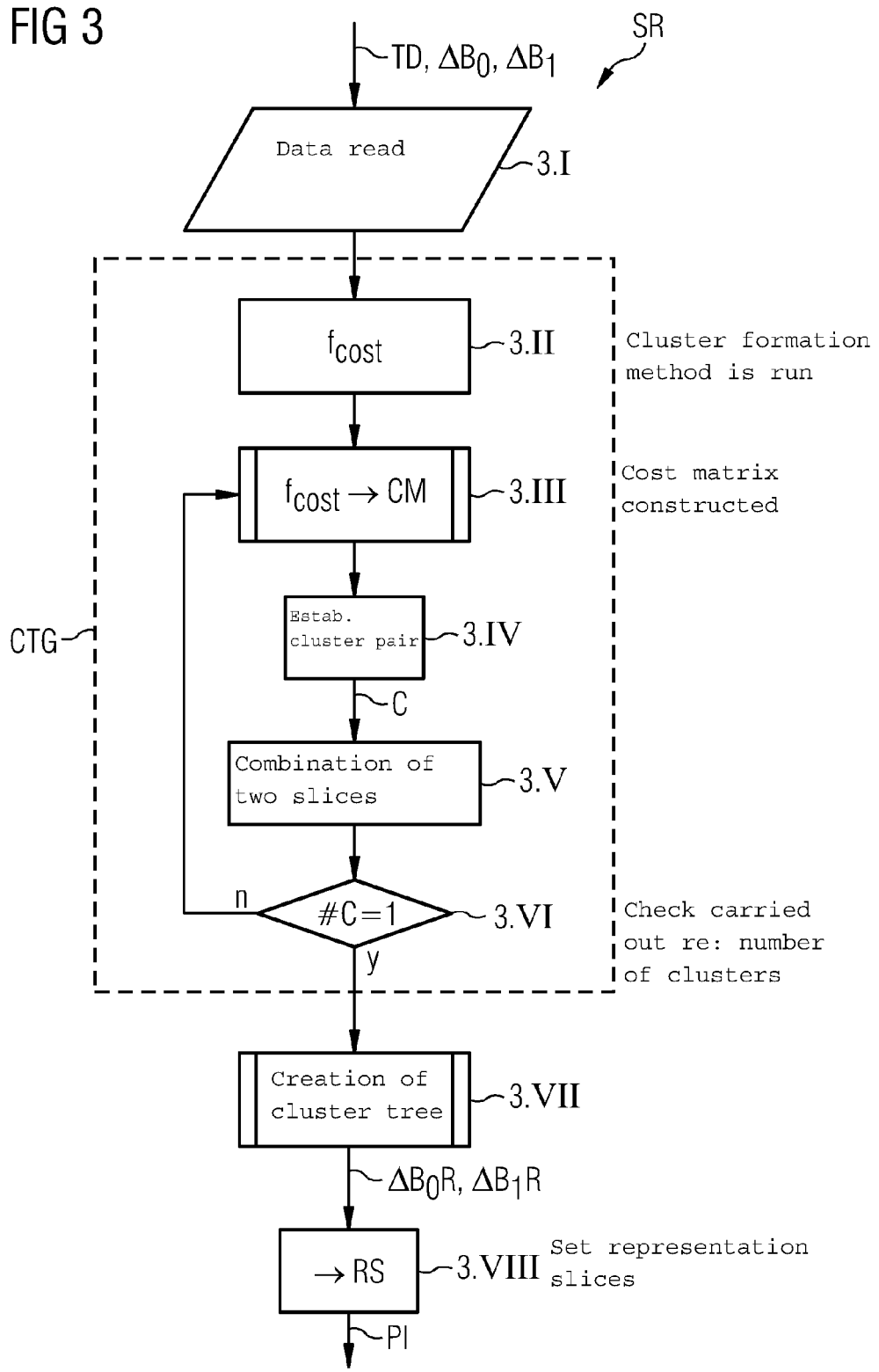
FIG. 3 depicts a flowchart for a possible sequence in accordance with one exemplary embodiment of the method for determining field distribution representation maps and field distribution representation slices.

A method procedure for the reduction is depicted schematically in the flowchart as per FIG. 3 as a slice reduction method SR. Since the method proceeds in the same manner, independently of whether the maps are $B_0$ maps or $B_1$ maps, the abbreviated term "maps" will only be used, for simplification purposes, in the subsequent text for both variants.

In act 3.I, the data is initially read, for example the $B_0$ maps $\Delta B_0$ and the $B_1$ maps $\Delta B_1$ which were currently acquired. Precisely what maps are read here depends on which form of the slice reduction process is employed. By way of example, if the goal is to establish field distribution representation slices RS for method act SRI in FIG. 2, training data TD with a multiplicity of $B_0$ maps and $B_1$ maps of various examination objects are adopted. By way of example, if only the $B_0$ maps are to be reduced in the current pass of the slice reduction method SR, it is sufficient if only the $B_0$ maps are entered. In respect of the $B_1$ maps, it depends on whether, for example, there may be a simultaneous reduction for all channels or a separate reduction for each transmission channel. Accordingly, it is also the case that the $B_1$ maps $\Delta B_1$ of one or more transmission channels are read for the various slices.

A cluster formation method CTG is run through, which initially starts in act 3.II with the current optimization criterion, e.g., a similarity error, being set. This may be brought about by defining a suitable cost function $f_{cost}$.

Such a cost function $f_{cost}$ for determining a similarity error may be defined in various ways. One embodiment lies in calculating a similarity error with the following cost function:

$$f_{cost} = \sum_{m,n} (A(m,n) - B(m,n))^2. \tag{2}$$

The costs correspond to the sum of the square of the deviations from one another of the image pixels of two maps A and B. Here, m and n are the indices for the individual pixels and $A(m, n)$ is the intensity value of the pixel (m, n) of the first map and $B(m, n)$ is the corresponding intensity value of the second one of the two maps, the deviation of one from the other is to be calculated.

As an alternative cost function $f_{cost}$, it may also be possible to use the correlation factor in accordance with the equation $$f_{cots} = 1 - r, \tag{3}$$

where:

$$r = \frac{\sum_m \sum_n (A(m,n) - A_{mean})(B(m,n) - B_{mean})}{\sqrt{\left(\sum_m \sum_n (A(m,n) - A_{mean})^2\right)\left(\sum_m \sum_n (B(m,n) - B_{mean})^2\right)}}. \tag{3a}$$

Here, $A_{mean}$ is the mean value over two dimensions of the complete map A and $B_{mean}$ is the corresponding mean value over the complete map B.

While the sum of the square of the differences in the first case also leads to great dissimilarity if the image information of B is only scaled in relation to the image information of A, such scalings are not taken into account in the correlation factor in the second variant, but rather this primarily relates to relative differences in the maps.

A further alternative for a cost function lies in so-called mutual information that may be calculated in the following manner:

$$f_{cost} = H(A) - \sum_a p(a) \sum p(b|a) \log_2 \frac{p(b|a)}{p(b)}. \tag{4}$$

Here, H is the entropy of the respective map A, $p(a)$ and $p(b)$ respectively are the probability distribution density (discrete marginal distribution) of the map A and B, respectively, $p(a|b)$ is the multivariate probability distribution density of A and B (the probability density of A on the condition of B).

Moreover, other cost functions are also possible. Moreover, the storage space for a cluster tree CT is initialized in act 3.II.

Figure 4:
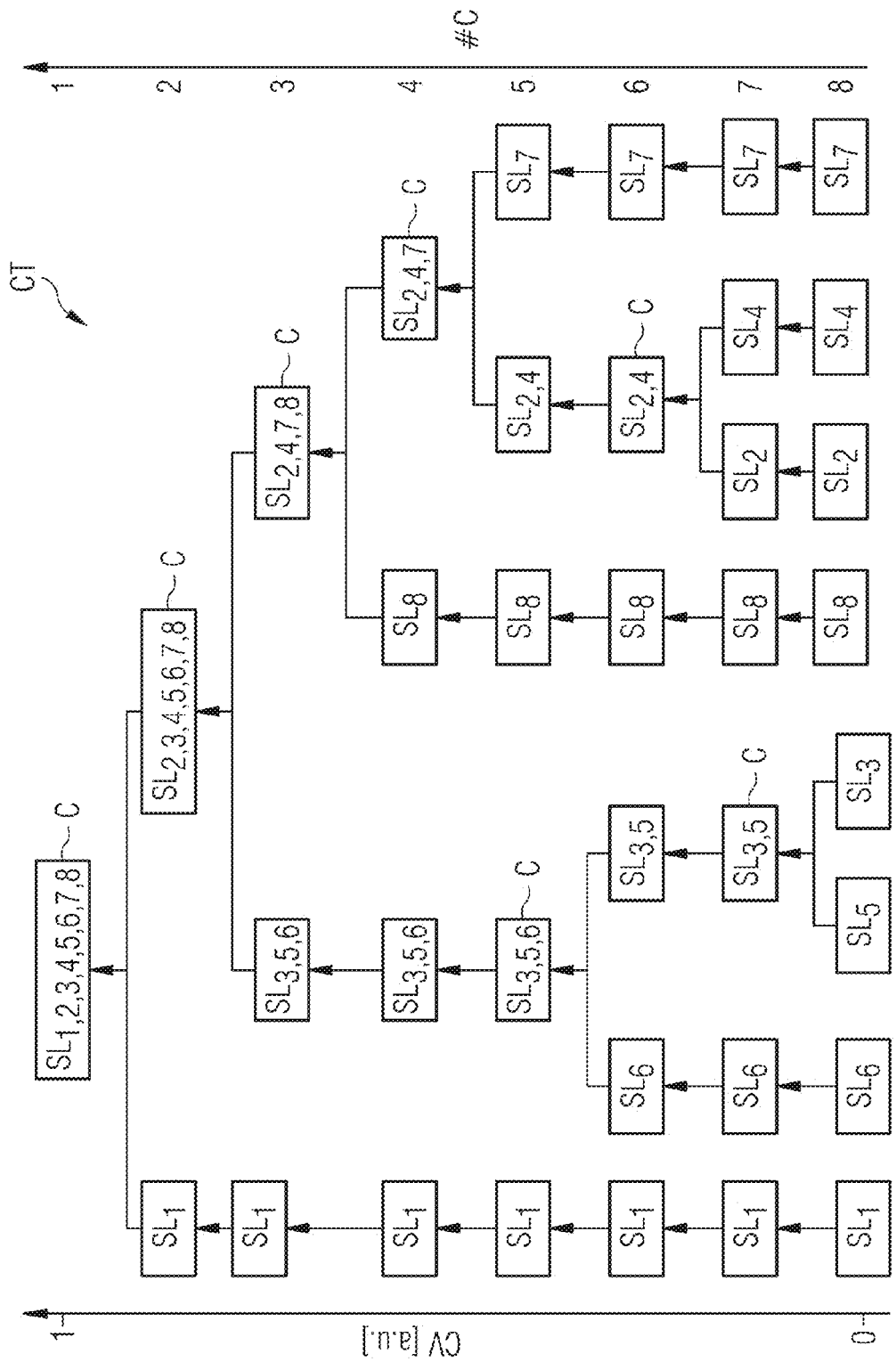
FIG. 4 depicts an embodiment for a cluster tree created in a method as per FIG. 3, with field distribution maps and field distribution map clusters.

What form such a cluster tree CT may take will become evident from the example depicted in FIG. 4 for maps of initially a total of eight slices $SL_1, SL_2, \ldots, SL_8$. In the lowest plane or level of this cluster tree CT, all eight slices $SL_1, SL_2, \ldots, SL_8$ are depicted here. This cluster tree CT is built upward within the scope of the further method level-by-level, as explained in the following text.

Figure 5:
FIG. 5 depicts an embodiment of a cost matrix for use in a method as per FIG. 3.

To this end, a cost matrix CM is initially constructed in act 3.III taking into account the previously defined cost function $f_{cost}$. As an example, such a cost matrix CM is depicted in FIG. 5. Here, FIG. 5 is a matrix for a total of n clusters or slices. For reasons of simplicity, individual slices are also treated as clusters or referred to as such within the scope of the following explanations in respect of the cost matrix CM or the cluster tree since. Individual slices, in principle, may also be interpreted as clusters with only a single slice.

In this cost matrix CM, one cost value cv is entered in each case for each combination of two currently existing clusters $C_1, C_2, C_3, \ldots, C_n$, where the cost value cv was calculated using the previously defined cost function. This leads to the matrix being symmetrical and only containing zeros on the diagonal. Therefore, in principle, it is sufficient to calculate the upper or lower triangle of the cost matrix.

On the basis of the current cost matrix, it is possible, in act 3.IV, to determine the cluster pair having the smallest cost value cv. It follows that this cluster pair is the two clusters that are most similar to one another.

If the method is still in the first level, e.g., in the lowermost plane of the cluster tree CT (see FIG. 4), the individual clusters of course still correspond to the individual slices $SL_1, SL_2, \ldots, SL_8$. Therefore, in this case, the method selects the slice pair in which the maps are the most similar to one another. By way of example, in FIG. 4, the slice pair is the clusters for the fifth and third slice. Accordingly, the two slices are combined to form a new cluster C. In the method progress as per FIG. 3, the combination takes place in act 3.V.

Moreover, for this level, a current similarity error (e.g., the cost value cv), is simultaneously also established for this level, which, in this first level corresponds to the cost value cv accepted by combining the two most similar slices.

In the cluster tree CT in FIG. 4, the cost value cv of the respective level is plotted on a scale on the left-hand side, with the plot here being normalized in arbitrary units to the maximum cost value of 1, which is achieved when ultimately only one single slice remains right at the top of the tree CT. The remaining number of slices is plotted in each case in the scale in the right-hand side.

In act 3.VI, a check is carried out as to whether the number of clusters is less than 1, e.g., whether the last level in the cluster tree CT has already been reached. If this is not the case (branch "n"), there is a return to act 3.III and the cost matrix CM is updated. That is to say there is a corresponding new generation of the cost matrix, but with one cluster fewer since of course two clusters from the previous matrix have now been combined. Naturally, the cost values cv may remain unchanged for all unchanged cluster pairs. An update of the cost value in relation to the other clusters is only required in respect of the combined cluster pair. There are likewise very different options, which, inter alia, depend on which representation map is used to represent the two newly grouped clusters together. This merger to form a cluster representation map may already have taken place in act 3.V. The recalculation of the cost matrix is brought about dependent thereon.

In a first variant, a representation map of the new cluster is calculated by virtue of the image information of the maps or clusters included in the cluster being combined in a suitable manner. By way of example, a type of mean value map is formed from the maps of previous clusters. To this end, it is only necessary to average the intensity values of the maps of both clusters or of the cluster representation maps thereof. For this mean value map, it is possible in each case to use the corresponding cost function, as defined in act 3.II, in order to establish a cost value cv with respect to the respective other still existing clusters C, which cost value may be described, for example, by the function $$cv_{x,i} = f_{cost}(\text{mean}(\forall I_k \in C_{x,N}), C_{i,N}). \quad (5)$$

Here, I represents the intensity values of the respective map. The index k represents all maps that are assigned to the newly formed cluster $C_{x,N}$. The index x is the index of the new cluster and the index N is the new overall number of clusters. The index i is a running index for i=1 ... N. That is to say, a mean value map is formed for the new cluster $C_{x,N}$ from all assigned maps and the respective costs in relation to the other clusters are updated. The cost function is calculated pixel-by-pixel, as was, for example, explained above with the aid of the various cost functions $f_{cost}$ as per equations (2) to (4).

Instead of calculating a new representation map for each new cluster, it is also possible to select one of the maps included in the cluster as a representation map for this cluster. For this, there are likewise different possibilities.

By way of example, in one variant, it is the map of the new cluster that has the lowest cost value in relation to the other clusters or the maps thereof that is selected. Mathematically, this may be described as follows:

$$I_{min} = \arg_{I_{min}} \min(f_{cost}(I_k, C_{i,N})) \text{ with } \forall I_k \in C_{x,N}. \quad (6)$$

The associated cost value for this grouping is:

$$cv_{x,i} = f_{cost}(I_{min}, C_{i,N}). \quad (6a)$$

In this version, that map $I_{min}$ that currently has the lowest cost value in relation to the other clusters is determined dynamically.

A further alternative consists of selecting the map of a cluster in which the costs to the other maps within this cluster are minimized. This method is expedient if more than two maps are contained in a cluster, e.g., if two clusters are merged where at least one cluster already contains two maps. In order to calculate these costs, it is possible to resort to the initial cost matrix constructed at the beginning of the method since said cost matrix contains the cost values between all maps existing at the outset. If only two individual maps are combined, it is possible to use the map, like in the aforementioned alternative, which has the minimum costs in relation to all other clusters.

If the map that has the lowest costs in relation to all other maps of the new cluster is in fact selected as representation map, there are once again two options for calculating the costs of the newly created cluster in relation to the other still remaining clusters.

In the first case, the lowest costs of the two newly grouped clusters in relation to the remaining clusters are adopted.

These costs may be established directly from the current cost matrix. Mathematically, this may be represented as follows:

$$cv_{x,i} = \min[f_{cost}(C_{x0,N+1}, C_{i,N}), f_{cost}(C_{x1,N+1}, C_{i,N})]. \quad (7)$$

In certain embodiments, the highest costs of the preceding clusters are used, which may be represented mathematically as follows:

$$cv_{x,i} = \max[f_{cost}(C_{x0,N+1}, C_{i,N}), f_{cost}(C_{x1,N+1}, C_{i,N})]. \quad (8)$$

Although the algorithm for an additional act promises the smallest change in costs when in the first case of using the lowest costs, this method may not guarantee an ideal solution from an overall point of view. The second case allows that the clusters are relatively narrow, e.g., that the individual maps in the clusters have a relatively large similarity to one another.

After updating the cost matrix CM in act 3.III, the cluster pair with the lowest costs on the basis of the current cost matrix CM is once again established in act 3.IV. In the example of FIG. 4, the cluster pair is the clusters for the second and the fourth slice $SL_2$, $SL_4$, which are grouped to form a new cluster C. In act 3.V, these two maps are merged in accordance with the predetermined rules to form a new cluster. For example, a suitable representation map for this cluster is newly calculated or selected and the cost value cv is also simultaneously updated in the current level by virtue of adding the current cost value, which specifies the costs accepted by the merger of this cluster C, to the cost value from the first level.

This method is continued until only one cluster C exists in the last level, which, as the only cluster, represents all eight maps together. The complete cluster tree CT is created and there may accordingly be a transition to act 3.VII in act 3.VI (branch "y").

How pronounced the reduction of the maps may be is set in this act 3.VII, e.g., what number of representation maps or what representation maps in the constructed cluster tree CT are best used for the further method is set. For this, there also once again are alternative strategies. The number of desired slices or maps may be set directly. By way of example, a user may enter that he only wishes to use four maps or measure maps at four positions in the subsequent method. These representation maps or the clusters or the associated slices may be identified with the aid of the cluster tree CT.

A further option consists of providing a percentage or proportionate reduction, for example to half of the slices initially present. A third alternative consists of taking into account the similarity error or the cost value cv and, for example, setting a threshold for this such that at most a specified cost value cv is accepted. This may also be set as a percentage between 0 and 1; for example, it is possible to set that an error value cv=0.5 is acceptable.

Figure 6:
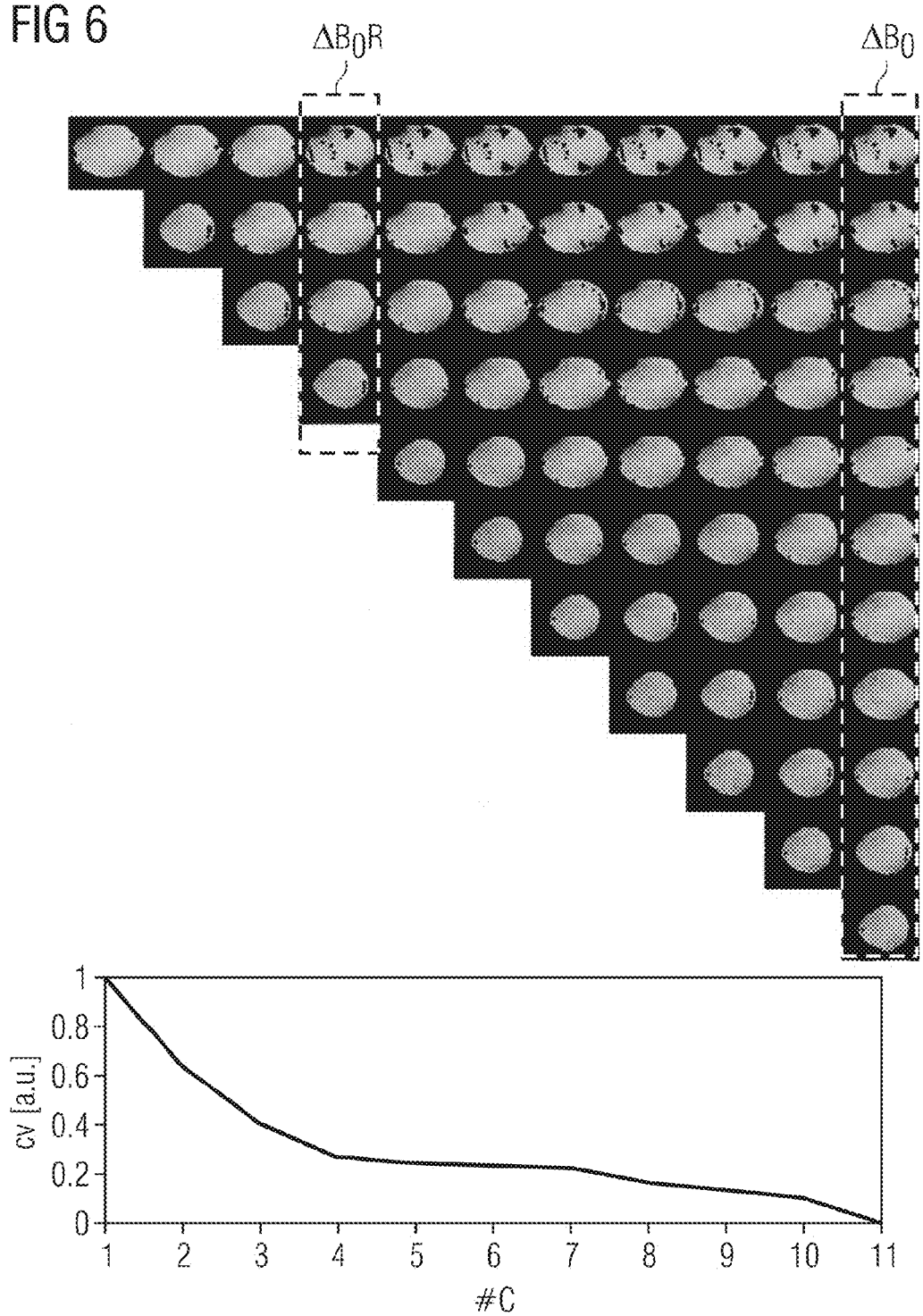
FIG. 6 depicts an embodiment of $B_1$ maps for 11 slices through a head of a subject and the field distribution representation maps established therefrom in 11 levels by a method as per FIG. 3 and graphics for displaying a relative similarity error depending on the number of field distribution representation maps in the respective level.

A fourth option consists of determining the number of slices taking into account the increase of the cost value cv (e.g., of the similarity error). This may be elucidated on the basis of FIG. 6. There, $B_1$ maps for 11 slices through the head of a subject are depicted in the upper region on the right-hand side. The respective representation maps in the various levels of the cluster tree are depicted to the left, e.g., one representation map less is required with every act to the left. In a diagram shown under this illustration, the relative cost value cv (e.g., in this case the relative similarity error) is once again plotted in arbitrary units (a. u.) over the number #C of clusters or maps. It may be seen here that the error is still contained up to a number of four slices (lies at most at 0.3) and the relative cost value cv increases relatively steeply upward to the value 1. Therefore, on the basis of the increase of the cost value cv, it may be expedient to set that work is carried out with four slices in the subsequent method. These four slices are denoted separately with a frame in the above illustration as $B_1$ representation maps $\Delta B_1 R$.

If the respective representation maps or clusters have been set, it is optionally possible in the method according to FIG. 3 also to set representative slices RS in a further act 3.VIII, the position information PI of which representative slices is used for subsequent measurements of new $B_1$ maps or $B_0$ maps, either for updating the $B_0$ maps and $B_1$ maps within a current measurement session or else, provided that the goal here is to process training data records, for example, to set field distribution representation slices RS suitable for further measurement sessions. By way of example, to this end, the position information PI for these slices may be stored in a measurement protocol.

As already mentioned above, it is possible to set these representation slices RS for different measurements depending on the respective examination object, depending on whether this is, e.g., a head measurement, an abdomen measurement, etc., this also depending on the respective type of instrument, etc. This merely depends on how the training data records were selected. A combination between the $B_0$ maps and $B_1$ maps for different examination objects, (e.g., for different patients/subjects within the training data records), may, as described above, take place in different ways.

Various simulation studies were performed in order to substantiate that, e.g., as a result of the reduction of $B_1$ maps for establishing an ideal radiofrequency pulse train, there are no effects on the achieved magnetization or excitation pattern in the examination object, and hence to substantiate that no falsifications are to be expected in the imaging. Use was made here of Bloch simulations, as were already mentioned briefly above. A 3D-EPI pulse sequence was respectively assumed in these simulations. The $B_0$ maps, e.g., the off resonances, were initially ignored for the simulations. 15° was assumed as target flip angle and a Newton optimization method was used as optimization method for establishing the pulse train.

The relative spatial excitation error of the excitation patterns was established in each case compared to a solution in which all $B_1$ maps were used in the optimization problem. The relative spatial excitation error is in this case calculated as root mean square error RMSE.

Figure 7:
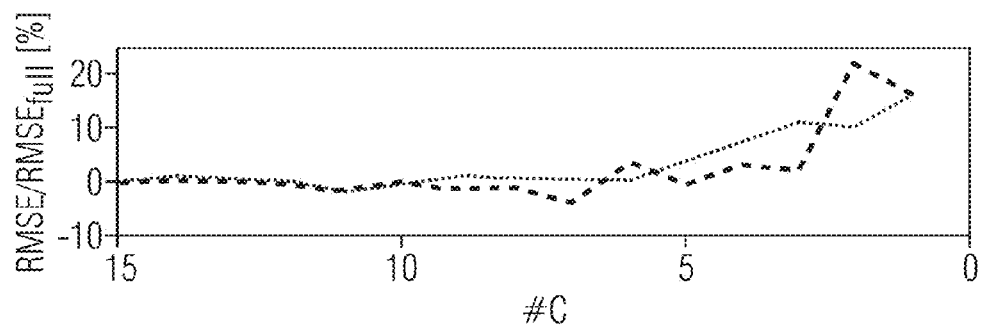
FIG. 7 depicts graphics for an embodiment a relative spatial excitation error (RMSE=root mean square error) in a (simulated) excitation of slices in the head of a subject.

FIG. 7 shows a graph in which the ratio of the RMSE with the $B_1$ maps, reduced, to the $RMSE_{full}$ of the solution with all $B_1$ maps is plotted in % over the number of utilized $B_1$ maps, e.g., the number #C of clusters. In this case, the maximum number of $B_1$ maps is 15. Here, two curves are depicted. The full curve shows a variant in which the correlation factor as per equation (3) is used as cost function $f_{cost}$ for calculating the cost matrix and the dotted curve shows a variant in which the sum of the differences squared as per equation (2) is employed as cost function $f_{cost}$. In order to determine the representation map for a cluster in both cases, respectively that map was used, which has the lowest costs in relation to all other maps within the cluster, and respectively the highest cost value of the previous clusters was adopted as cost value cv for the respective new cluster in relation to the other existing clusters in order to update the cost matrix.

What may be seen here is that a reduction to approximately one third of the slices, namely to only five slices, is possible without there being a significant increase in the relative spatial excitation error. In actual fact, it is the case that a value of just under 0 is reached at some points, e.g., that the relative spatial excitation error has in fact been improved over the use of all $B_1$ maps. No differences may be found either in the excitation patterns produced using the Bloch simulations. It was moreover found that, in particular, the use of the highest cost value of the previous clusters as new cost value when updating the cost matrix, as a result of which narrow clustering is achieved, is advantageous.

The above examples therefore show that a significant reduction in the acquisition time may be achieved if the method is used to determine suitable representation slices already in advance, with the $B_1$ maps and $B_0$ maps only being established for the slices. However, in any case, it is possible to achieve a significant reduction in the calculation time for multi-slice pTX radiofrequency pulses and likewise a significant reduction in the number of multi-slice pTX radiofrequency pulse establishment cycles if an ideal radiofrequency pulse train is to be established separately for each of the slices. Since the dimensions of the optimization problem are reduced, an improved excitation performance may be achieved. Incidentally, the time that is saved may also be employed to establish higher resolution $B_1$ maps or $B_0$ maps or to establish $B_1$ maps or $B_0$ maps more frequently in order to take into account patient movements. All advantages become ever more noticeable with increasing number of transmission channels.

In particular, the method is also advantageous in that no additional hardware is required. In principle, it may be applied to all previously known MR machines, e.g., both in systems with only one transmission channel and also in pTX systems.

Finally, reference is once again made to the fact that the above-described detailed methods and configurations are exemplary embodiments and that the basic principle may also be varied by the person skilled in the art in additional areas without departing from the scope of the embodiments, to the extent that it is predetermined by the claims. For the sake of completeness, reference is also made to the fact that the use of the indefinite article "a" or "an" does not preclude the possibility of the relevant features being present a number of times. Likewise, the terms "unit" and "module" do not preclude the terms from consisting of several components, which optionally may also be distributed in space.

A list of reference signs used within the above-described embodiments are provided in the table below.

| 1 | Magnetic resonance system | 2 | Magnetic resonance scanner | 3 | Main field magnet |
|---|---|---|---|---|---|
| 4 | Gradient system | 5 | Whole body radiofrequency coil | 6 | Local coil |
| 7 | Couch | 8 | Examination space | 9 | Field of view/FoV |
| 10 | Control apparatus | 11 | Gradient control unit | 12 | Radiofrequency transmission/reception unit |

-continued

| 13 | RF reception unit | 14 | Reconstruction unit | 15 | Measurement control unit |
| 16 | Memory | 17 | Terminal interface | 20 | Terminal |
| 21 | Computer | 22 | Control sequence establishment apparatus | 23 | Input interface |
| 24 | RF pulse establishment unit | 25 | Output interface arrangement | 27 | Monitor |
| 28 | Keyboard | 30 | Field distribution map analysis apparatus | 31 | Input interface arrangement |
| 32 | Field distribution map grouping module | 33 | Representation slices establishment module | 34 | Output interface arrangement |
| m | Target magnetization | O | Patient/examination object | P | Control protocol |
| AS | Magnetic resonance system actuation sequence | BD | Image data | GP | Gradient pulse train |
| MP | Multichannel pulse train | NW | Network | RD | Raw data |
| SGx, SGy, SGz | Control signal | S1, . . . , SN | Transmission channel | kTT | k-space gradient trajectory type |
| SP | System specific parameter | ST | Sequence type | $\Delta B0$ | Field distribution map/ B0 map |
| $\Delta B1$ | Field distribution map/ B1 map | $\Delta B0R$ | Field distribution representation maps | $\Delta B1R$ | Field distribution representation maps |
| TD | Training data | SL | Slices | SL1, SL2, . . . , SL8 | Slices |
| SR | Slice reduction method | RS | Field distribution representation slices | PI | Position information |
| fcost | Cost function | CTG | Cluster formation method | C | Field distribution map cluster/cluster |
| CT | Cluster tree | C1, C2 C3, . . . , Cn | Clusters | CM | Cost matrix |
| cv | Cost value | #C | Number of clusters | RMSE | Root mean square error |

It is to be understood that the elements and features recited in the appended claims may be combined in different ways to produce new claims that likewise fall within the scope of the present invention. Thus, whereas the dependent claims appended below depend from only a single independent or dependent claim, it is to be understood that the dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method for establishing a magnetic resonance system actuation sequence, the method comprising:
acquiring field distribution maps only for a number of field distribution representation slices, wherein the field distribution representation slices represent a number of slices of a measurement region of the magnetic resonance system, wherein the number of field distribution representation slices is less than the number of slices of the measurement region;
establishing at least one radiofrequency pulse train based on the number of field distribution representation maps; and
operating the magnetic resonance system using the magnetic resonance system actuation sequence, wherein the at least one radiofrequency pulse train is emitted into the measurement region.

2. The method as claimed in claim 1, wherein the optimization criterion comprises a similarity between field distribution maps in accordance with a defined similarity measure.

3. The method as claimed in claim 1, wherein the field distribution representation slices are established by a cluster formation method, wherein the field distribution maps are grouped to form field distribution map clusters in accordance with a predetermined optimization criterion.

4. The method as claimed in claim 3, wherein the grouping is brought about in several levels, wherein, in each level, two field distribution maps or two field distribution map clusters are grouped together to form one field distribution map cluster for a next level, wherein the two field distribution maps or the two field distribution map clusters have a smallest deviation from one another in accordance with a predetermined optimization criterion.

5. The method as claimed in claim 4, wherein deviations between two field distribution maps or field distribution map clusters are established by a cost function, a cost value, or the cost function and the cost value calculated for each level of the cluster formation method.

6. The method as claimed in claim 4, wherein a cost matrix is produced for a set of field distribution maps or field distribution map clusters, and wherein the cost matrix is updated in each level.

7. The method as claimed in claim 1, wherein the number of field distribution representation slices is determined based on at least one of the following criteria:
(a) a predetermined minimum number of field distribution representation slices;
(b) a predetermined reduction level;
(c) a maximum admissible cost value; or
(d) an increasing property of a cost value depending on the number of field distribution representation slices.

8. The method as claimed in claim 1, wherein the field distribution representation slices are established taking into account at least one of the following further input parameters:

(a) a weighting value for the field distribution maps;
(b) a defined region of interest within the measurement region; or
(c) sequence type of the magnetic resonance system actuation sequence to be generated.

9. A field distribution map analysis apparatus comprising:
an input interface arrangement configured to detect a number of field distribution maps;
a field distribution map grouping module configured to establish, based on the number of field distribution maps, a number of clusters of field distribution maps or a number of field distribution representation maps that represent the number of field distribution maps in accordance with a predetermined optimization criterion, wherein the number of field distribution representation maps is less than the number of field distribution maps;
an output interface arrangement configured to output established field distribution representation maps or position information with respect to a number of field distribution representation slices;
an RF pulse establishment unit configured to establish a radiofrequency pulse train based on the field distribution maps or the field distribution representation maps; and
a radiofrequency transmission apparatus configured to emit the radiofrequency pulse train into a measurement region using a magnetic resonance system actuation sequence.

10. The apparatus of claim 9, further comprising:
a representation slice establishment module which is configured to establish, based on the clusters of field distribution maps or the field distribution representation maps, the number of field distribution representation slices.

11. A magnetic resonance system comprising:
a radiofrequency transmission apparatus comprising a gradient system;
a control apparatus; and
a control sequence establishment apparatus,
wherein the radiofrequency transmission apparatus is configured to emit a radiofrequency pulse train to carry out a desired measurement based on an actuation sequence and, coordinated therewith, to emit a gradient pulse train by the gradient system, and
wherein the control sequence establishment apparatus is configured to establish the actuation sequence and transmit the actuation sequence to the control apparatus, the control sequence establishment apparatus comprising:
an input interface arrangement for detecting a number of field distribution maps;
a field distribution map grouping module configured to establish, based on the number of field distribution maps, a number of clusters of field distribution maps or a number of field distribution representation maps that represent the number of field distribution maps in accordance with a predetermined optimization criterion, wherein the number of field distribution representation maps is less than the number of field distribution maps; and
an output interface arrangement for outputting established field distribution representation maps or position information with respect to a number of field distribution representation slices.

12. A non-transitory computer-readable storage medium having stored therein a computer program for carrying out a magnetic resonance system actuation sequence when executed by a computer, the storage medium comprising instructions for:
acquiring field distribution maps only for a number of field distribution representation slices, wherein the field distribution representation slices represent a number of slices of a measurement region of the magnetic resonance system, wherein the number of field distribution representation slices is less than the number of slices of the measurement region;
establishing at least one radiofrequency pulse train based on the number of field distribution representation maps; and
operating the magnetic resonance system using the magnetic resonance system actuation sequence, wherein the at least one radiofrequency pulse train is emitted into the measurement region.

13. A method for establishing a magnetic resonance system actuation sequence, the method comprising:
acquiring a number of field distribution maps for slices of the measurement region;
establishing, using a predetermined optimization criterion, a number of field distribution representation maps based on the number of acquired field distribution maps, wherein the number of field distribution representation maps is less than the number of acquired field distribution maps;
establishing at least one radiofrequency pulse train based on the number of field distribution representation maps; and
operating the magnetic resonance system using the magnetic resonance system actuation sequence, wherein the at least one radiofrequency pulse train is emitted into the measurement region.

14. The method of claim 13, further comprising:
establishing field distribution representation slices based on a plurality of training data records of different examination objects,
wherein each field distribution representation slice of the field distribution representation slices comprises a plurality of acquired field distribution maps for a relevant examination object.

15. The method of claim 14, wherein the field distribution representation maps represent the plurality of acquired field distribution maps in accordance with the predetermined optimization criterion, and the field distribution representation slices are established based on the field distribution representation maps.

16. The method of claim 15, wherein the field distribution representation maps comprise a subset of the number of field distribution maps or values of a field distribution representation map are generated from the field distribution maps represented by the relevant field distribution representation map.

17. The method of claim 14, wherein the field distribution representation maps comprise a subset of the number of field distribution maps or values of a field distribution representation map are generated from the field distribution maps represented by the relevant field distribution representation map.

18. The method of claim 13, wherein the field distribution representation maps comprise a subset of the number of field distribution maps or values of a field distribution representation map are generated from the field distribution maps represented by the relevant field distribution representation map.

19. The method of claim 13, wherein the field distribution representation maps are established by a cluster formation method, wherein the field distribution maps are grouped to form field distribution map clusters in accordance with the predetermined optimization criterion.

20. The method of claim 13, wherein the number of field distribution representation maps is determined based on at least one of the following criteria:
 (a) a predetermined minimum number of field distribution representation maps;
 (b) a predetermined reduction level;
 (c) a maximum admissible cost value;
 (d) an increasing property of a cost value depending on the number of the field distribution representation maps; or
 (e) a criteria for an ideal selection of the field representation maps determined from training data records.

21. The method of claim 13, wherein the field distribution representation maps are established taking into account at least one of the following further input parameters:
 (a) a weighting value for the field distribution maps;
 (b) a defined region of interest within the measurement region; or
 (c) sequence type of the magnetic resonance system actuation sequence to be generated.

\* \* \* \* \*